(12) United States Patent
Ishikawa et al.

(10) Patent No.: US 12,203,161 B2
(45) Date of Patent: Jan. 21, 2025

(54) COMPONENT FOR PLASMA PROCESSING APPARATUS AND PLASMA PROCESSING APPARATUS INCLUDING COMPONENT

(71) Applicant: KYOCERA Corporation, Kyoto (JP)

(72) Inventors: Kazuhiro Ishikawa, Shiga (JP); Takashi Hino, Yokohama (JP); Shuichi Saito, Yokohama (JP)

(73) Assignee: Kyocera Corporation, Kyoto (JP)

( * ) Notice: Subject to any disclaimer, the term of this patent is extended or adjusted under 35 U.S.C. 154(b) by 294 days.

(21) Appl. No.: 17/764,141

(22) PCT Filed: Sep. 29, 2020

(86) PCT No.: PCT/JP2020/036936
§ 371 (c)(1),
(2) Date: Mar. 25, 2022

(87) PCT Pub. No.: WO2021/065919
PCT Pub. Date: Apr. 8, 2021

(65) Prior Publication Data
US 2022/0325399 A1 Oct. 13, 2022

(30) Foreign Application Priority Data

Sep. 30, 2019 (JP) .................. 2019-179677

(51) Int. Cl.
| | |
|---|---|
| *C23C 14/06* | (2006.01) |
| *C23C 14/08* | (2006.01) |
| *C23C 14/34* | (2006.01) |
| *H01J 37/34* | (2006.01) |

(52) U.S. Cl.
CPC ........ *C23C 14/081* (2013.01); *C23C 14/0641* (2013.01); *C23C 14/3407* (2013.01); *H01J 37/3426* (2013.01); *H01J 2237/332* (2013.01)

(58) Field of Classification Search
CPC .............. C23C 14/081; C23C 14/0641; C23C 14/3407; H01J 37/3426; H01J 2237/332
USPC .................. 118/715; 204/298.01–298.41
See application file for complete search history.

(56) References Cited

U.S. PATENT DOCUMENTS

| | | | |
|---|---|---|---|
| 2006/0178010 A1 | 8/2006 | Iwasawa et al. | |
| 2012/0103519 A1* | 5/2012 | Aheem | C23C 14/083 427/256 |
| 2017/0022595 A1* | 1/2017 | Sato | C23C 4/18 |
| 2018/0304376 A1* | 10/2018 | Kawahara | B23B 27/148 |
| 2019/0272981 A1* | 9/2019 | Xu | H01J 37/3244 |
| 2020/0354827 A1* | 11/2020 | Ko | C23C 14/34 |

(Continued)

FOREIGN PATENT DOCUMENTS

| | | | |
|---|---|---|---|
| JP | 2005-217351 A | 8/2005 | |
| WO | WO-2019054617 A1 * | 3/2019 | ............. C23C 14/18 |

*Primary Examiner* — Charlee J. C. Bennett
(74) *Attorney, Agent, or Firm* — Procopio, Cory, Hargreaves & Savitch LLP

(57) ABSTRACT

A component for a plasma processing apparatus includes a substrate and a film on at least a part of the substrate. The film includes an oxide, a fluoride, an oxyfluoride, or a nitride of a rare earth element. A ratio σ22/σ11 of a compressive stress σ11 to occur across a surface of the film to be exposed to plasma and a compressive stress σ22 to occur across the surface in a direction perpendicular to the compressive stress σ11 is 5 or less. A plasma processing apparatus includes the above component.

15 Claims, 2 Drawing Sheets

(56) References Cited

U.S. PATENT DOCUMENTS

2020/0402773 A1\* 12/2020 Ishikawa ........... H01J 37/32495
2022/0181123 A1\* 6/2022 Ishikawa ............. C23C 16/4404

\* cited by examiner

COMPONENT FOR PLASMA PROCESSING APPARATUS AND PLASMA PROCESSING APPARATUS INCLUDING COMPONENT

FIELD

The present disclosure relates to a component for a plasma processing apparatus and a plasma processing apparatus including the component.

BACKGROUND

A component for a plasma processing apparatus with a known technique is described in, for example, Patent Literature 1.

CITATION LIST

Patent Literature

Patent Literature 1: Japanese Unexamined Patent Application Publication No. 2005-217351

BRIEF SUMMARY

A component for a plasma processing apparatus according to an aspect of the present disclosure includes a substrate and a film on at least a part of the substrate. The film includes an oxide, a fluoride, an oxyfluoride, or a nitride of a rare earth element. A ratio $\sigma 22/\sigma 11$ of a compressive stress $\sigma 11$ to occur across a surface of the film to be exposed to plasma and a compressive stress $\sigma 22$ to occur across the surface in a direction perpendicular to the compressive stress $\sigma 11$ is 5 or less.

A plasma processing apparatus according to an aspect of the present disclosure includes the component according to the above aspect of the present disclosure.

Advantageous Effects

The component for a plasma processing apparatus according to the above aspect of the present disclosure has high strength of bonding to the substrate over a long period of time.

The plasma processing apparatus according to the above aspect of the present disclosure is highly reliable.

BRIEF DESCRIPTION OF DRAWINGS

The objects, features, and advantages of the present disclosure will become more apparent from the following detailed description and the drawings.

DETAILED DESCRIPTION

The structure of a component that forms the basis of a component for a plasma processing apparatus according to one or more embodiments of the present disclosure will be described. A plasma processing apparatus may include components to have high plasma resistance. Such a component may include a substrate and a film of yttrium oxide on the substrate.

As an example of such components for a plasma processing apparatus, Patent Literature 1 describes a component to be placed in a plasma processing compartment. The component includes a substrate with its surface coated with a $Y_2O_3$ film having a purity of 95% or greater by mass formed by thermal spraying.

However, the $Y_2O_3$ film with high purity formed by thermal spraying can have numeral pores per unit area. The film is to maintain high strength of bonding to the substrate over a long time for use in an environment involving repeated temperature rises and falls.

A component for a plasma processing apparatus according to one or more embodiments of the present disclosure will now be described in detail with reference to the drawings.

Figure 1A:
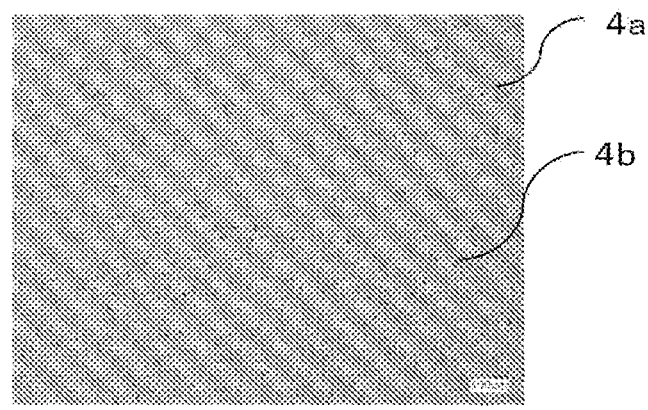
FIG. 1A is a micrograph of the surface of a film included in a component for a plasma processing apparatus according to one or more embodiments of the present disclosure taken by an optical microscope.
Figure 1B:
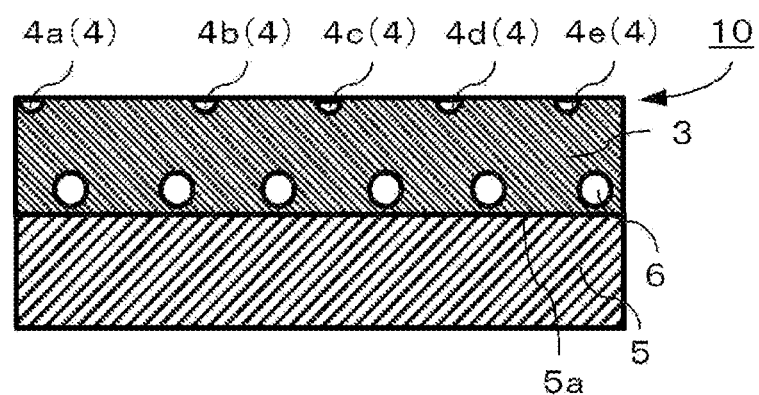
FIG. 1B is a cross-sectional view of the component showing the film covering an upper surface of a substrate.
Figure 1C:
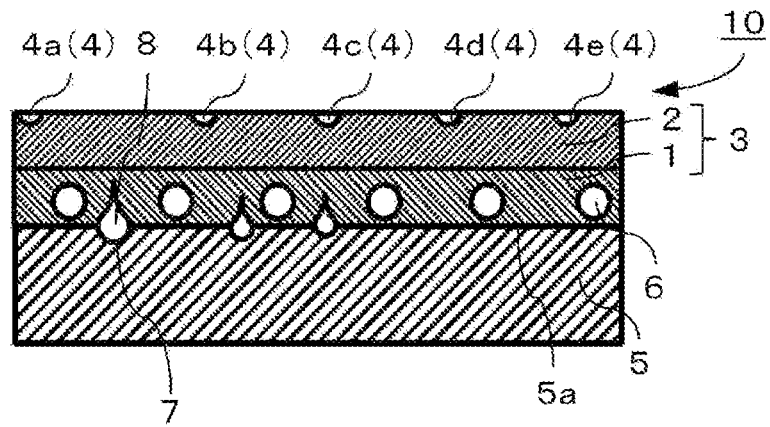
FIG. 1C is a cross-sectional view of a component illustrating a film including a first layer (lower layer) on the substrate and a second layer (upper layer) on the first layer (lower layer).

As shown in FIGS. 1A to 1C, a component 10 for a plasma processing apparatus according to one or more embodiments of the present disclosure includes a substrate 5 and a film 3 of an oxide, a fluoride, an oxyfluoride, or a nitride of a rare earth element formed on at least a part of the substrate 5. In an example shown in FIG. 1B, the substrate 5 has an upper surface 5a coated with the film 3. In another example shown in FIG. 1C, the film 3 includes a first layer (lower layer) 1 located on the substrate 5 and a second layer (upper layer) 2 located on the first layer (lower layer) 1. The ratio t1:t2 of the thickness t1 of the first layer 1 to the thickness t2 of the second layer 2 is, for example, 4:6 to 6:4.

For the component 10 for a plasma processing apparatus, the surface of the film 3 to be exposed to plasma has a compressive stress $\sigma 11$ to occur across the surface and a compressive stress $\sigma 22$ to occur across the surface in the direction perpendicular to the compressive stress $\sigma 11$. The ratio of $\sigma 22/\sigma 11$ is 5 or less.

At the ratio of $\sigma 22/\sigma 11$ within the above range, shrinkage and expansion across the surface cause no anisotropy in use in an environment involving repeated temperature rises and falls. This structure allows a longer period of use.

In particular, the ratio of $\sigma 22/\sigma 11$ may be 0.1 to 1.5 inclusive, or 1.1 to 1.4 inclusive.

The arithmetic mean of the compressive stress $\sigma 11$ and the compressive stress $\sigma 22$ may be 200 to 1000 MPa inclusive. The film 3 having the arithmetic mean of 200 MPa or greater maintains hardness and thus can release fewer particles upon receiving impact from floating particles in a plasma processing apparatus. Thus, the plasma processing apparatus is less likely to be contaminated with such particles. The film 3 having the arithmetic mean of 1000 MPa or less withstands internal tensile stress occurring in the above environment. Thus, the film is less likely to break.

The coefficient of variation of each of the compressive stress $\sigma 11$ and the compressive stress $\sigma 22$ may be 0.5 or less. The film 3 having the coefficient of variation of 0.5 or less is less likely to detach from the substrate 2, with less local strain occurring during use in the above environment.

In particular, the coefficient of variation may be 0.3 or less.

The values of the compressive stress $\sigma 11$ and the compressive stress $\sigma 22$ may be measured with a two-dimensional (2D) method using an X-ray diffractometer. The resulting values may be used to calculate the ratio of σ22/σ11, the arithmetic mean, and the coefficient of variation.

The surface of the film 3 to be exposed to plasma (the upper surface in FIGS. 1B and 1C, hereafter simply referred to as the surface) has an arithmetic mean roughness Ra of 0.01 to 0.1 μm inclusive. The surface also has multiple pores 4.

FIG. 1A shows the structure with multiple pores 4a, 4b, . . . . The surface of the film 3 includes a surface portion newly exposed in response to the film being thinner after plasma exposure. The film 3 internally has multiple closed pores 6.

The arithmetic mean roughness Ra may be measured in accordance with JIS B 0601-2013. More specifically, the arithmetic mean roughness Ra may be measured with a surface roughness measuring instrument (Surfcorder) SE500 (Kosaka Laboratory Ltd.), with the probe radius of 5 μm, the measurement length of 2.5 mm, and the cutoff value of 0.8 mm.

In FIGS. 1B and 1C, the film 3 is shown clearly for ease of explanation, but does not show the exact correlation between the thicknesses of the substrate 5 and the film 3.

The film 3 is a film of an oxide, a fluoride, an oxyfluoride, or a nitride of a rare earth element (hereafter, an oxide, a fluoride, an oxyfluoride, and a nitride are collectively referred to as compounds). Examples of the rare earth element include yttrium (Y), cerium (Ce), samarium (Sm), gadolinium (Gd), dysprosium (Dy), erbium (Er), and ytterbium (Yb). The rare earth element being yttrium has high corrosion resistance and is less expensive than other rare earth elements, and is thus cost effective.

The composition of yttrium compound has the chemical formula $Y_2O_{3-x}$ (0≤x≤1), $YF_3$, YOF, $Y_5O_4F_7$, $Y_5O_6F_7$, $Y_6O_5F_8$, $Y_7O_6F_9$, $Y_{17}O_{14}F_{23}$, or YN. The elements of the film 3 may be identified with a thin film X-ray diffractometer.

The film 3 may contain, in addition to a compound of a rare earth element, other elements such as fluorine (F), sodium (Na), magnesium (Mg), aluminum (Al), silicon (Si), phosphorus (P), sulfur (S), chlorine (CO, potassium (K), calcium (Ca), titanium (Ti), chromium (Cr), manganese (Mn), iron (Fe), cobalt (Co), nickel (Ni), copper (Cu), zinc (Zn), and strontium (Sr), depending on the purity of a target used to form the film 3 and the configuration of a device used.

The substrate 5 may be formed from, for example, quartz, a translucent ceramic material, aluminum having a purity of 99.999% (5N) or greater, an aluminum alloy such as aluminum 6061 alloy, an aluminum nitride ceramic material, or an aluminum oxide ceramic material. An aluminum oxide ceramic material has an aluminum oxide content of 90% or greater by mass of the total mass (100%) of the elements contained in the substrate 5. The content of aluminum oxide is the value obtained by converting Al to $Al_2O_3$. The same applies to an aluminum nitride ceramic material.

The aluminum oxide ceramic material may contain magnesium oxide, calcium oxide, silicon oxide, and other elements in addition to aluminum oxide. The substrate 5 formed from quartz or a translucent ceramic material has a content of 0.01 ppm or less by mass of each of lithium (Li), K, Na, Cr, Fe, Co, Ni, and Cu. The translucent ceramic material mainly contains, for example, aluminum oxide or yttrium aluminum complex oxide.

The film 3 has multiple pores 4, for which a value A resulting from subtracting an average of circular equivalent diameters of the pores 4 from an average of distances between the centroids of neighboring pores 4 is 28 to 48 μm inclusive.

The value A being 28 to 48 μm inclusive indicates fewer, smaller pores 4 being dispersed. The component 10 for a plasma processing apparatus with the above structure thus produces fewer particle inside the pores 4. In addition, the pores 4 are dispersed enough to prevent microcracks originating from any pores 4 nearby from extending, thus causing fewer particles from extended microcracks.

In the component 10 for a plasma processing apparatus according to one or more embodiments of the present disclosure, the film 3 may have multiple pores 4 constituting 1.5 to 6% inclusive of its total area. The pores 4 constituting 1.5 to 6% inclusive of the total area can prevent extension of any microcracks on the surface exposed to plasma (including a surface newly exposed in response to the film being thinner after plasma exposure), thus allowing the film 3 to have fewer particles resulting from microcracks. The area ratio of pores 4 on the surface exposed to plasma is low, with fewer particles produced inside the pores 4.

In the component 10 for a plasma processing apparatus according to one or more embodiments of the present disclosure, the film 3 may have the pores 4 with an average sphericity of 60% or greater. With the sphericity of the pores 4 within this range, residual stress is less likely to accumulate around the pores 4. The film 3 exposed to plasma is thus less likely to have particles around the pores 4.

The sphericity of the pores 4 herein refers to the ratio defined by a graphite area method and is defined by Formula 1 below.

$$\text{Sphericity of a pore (\%)} = \{(\text{actual area of the pore})/(\text{area of the smallest circumscribed circle of the pore})\} \times 100 \quad (1)$$

In particular, the average sphericity of the pores 4 may be 62% or greater.

The average of distances between the centroids of the pores 4, the average of circular equivalent diameters of the pores 4, the area ratio, and the sphericity can be determined as described below.

First, the surface of the film 3 is observed with a digital microscope at a magnification of 100×. For example, an observation image captured with a charge-coupled device (CCD) camera across an area of 7.68 mm² (with a lateral length of 3.2 mm and a vertical length of 2.4 mm) is analyzed. The average of distances between the centroids of the pores 4 can be obtained through dispersion measurement with image analysis software A-Zou Kun (ver. 2.52) (registered trademark, Asahi Kasei Engineering Corporation).

Using the same observation image as described above, the average of the circular equivalent diameters of the pores 4, the area ratio, and the sphericity can be obtained through particle analysis with the image analysis software A-Zou Kun.

The setting conditions for dispersion measurement and particle analysis may include the threshold indicating the brightness of an image set to 140, the brightness set to dark, the small object removal area set to 1 μm², and the noise reduction filter set to use. Although the threshold is set to 140 in the above measurement setting, the threshold may be adjusted depending on the brightness of the observation image. With the brightness set to dark, the binarization method set to manual, the small object removal area set to 1 μm², and the noise reduction filter set to use, the threshold may be adjusted to cause the marked areas on the observation image to match the shapes of the pores 4.

In the component 10 for a plasma processing apparatus according to one or more embodiments of the present disclosure, the kurtosis Ku of circular equivalent diameters of the pores 4 on the film 3 may be 0.5 to 2 inclusive. When the kurtosis Ku of circular equivalent diameters of the pores 4 is within this range, the distribution of circular equivalent diameters of the pores 4 is narrower, and fewer pores 4 have abnormally large circular equivalent diameters. This reduces microcrack extension, produces fewer particles inside the pores 4, and increases plasma resistance. After deposition, the film 3 with the above structure may be polished with less uneven abrasion and can have intended surface profiles with minimum polishing. In particular, the kurtosis Ku may be 1.3 to 1.9 inclusive.

Kurtosis Ku is an indicator (statistic) of differences in the peak and tails of a distribution from those of a normal distribution. The kurtosis Ku being Ku>0 indicates that the distribution has a sharper peak with longer and wider tails, Ku=0 indicates a normal distribution, and Ku<0 indicates a distribution having a rounded peak with shorter and narrower tails. The kurtosis Ku of the circular equivalent diameters of the pores 4 can be obtained using the function Kurt available with Excel (registered trademark, Microsoft Corporation).

In the component 10 for a plasma processing apparatus according to one or more embodiments of the present disclosure, the skewness Sk of circular equivalent diameters of the pores 4 on the film 3 may be 3 to 5.6 inclusive. When the skewness Sk of circular equivalent diameters of the pores 4 is within this range, the average of circular equivalent diameters of the pores 4 is smaller, and fewer pores 4 have abnormally large circular equivalent diameters. This reduces microcrack extension, produces fewer particles inside the pores 4, and increases plasma resistance. After deposition, the film 3 with the above structure may be polished with less uneven abrasion and can have intended surface profiles with minimum polishing. In particular, the skewness Sk may be 3.2 to 5.3 inclusive.

Skewness Sk is an indicator (statistic) of the degree of a skewed distribution from a normal distribution, or the symmetry of the distribution. The skewness Sk being Sk>0 indicates the tail of the distribution extending to the right, and Sk=0 indicates a symmetrical distribution, and Sk<0 indicates the tail of the distribution extending to the left. The Skewness Sk of circular equivalent diameters of the pores can be obtained using the function SKEW available with Excel (registered trademark, Microsoft Corporation).

The relative density of the film may be 98% or greater, or more specifically, 99% or greater. The film 3 with the relative density within this range is dense and produces fewer particles when being exposed to plasma and becoming thinner. The relative density of the film 3 may be determined by obtaining its actual density with X-ray reflectometry (XRR) using a thin-film X-ray diffractometer and calculating the ratio of the actual density to the theoretical density.

The film 3 includes voids 8 extending in the thickness direction from recesses 7 on the surface of the substrate 5 facing the film 3. The voids 8 may have closed tips inside the film 3. The recesses 7 are either pores or void areas on the surface of the substrate 5 facing the film 3. The recesses 7 are on surface of the substrate 5 before the film 3 is formed.

The film 3 with the voids 8 can undergo repeated temperature rises and falls with less residual stress accumulating. The voids 8 are not connected to the outside and thus have particles in the voids 8 without being out of the film 3.

In the thickness direction of the film 3 in a cross section, each void 8 may be narrower in its part nearer the surface of the film 3 than in its part nearer the recess 7 on the substrate 5. Compared with a void 8 wider in its part nearer the surface of the film 3 than in its part nearer the recess 7 on the substrate 5, this structure can cause fewer particles in the voids 8 to be out of the film 3, although any voids 8 are open at their tips after the film 3 is exposed to plasma and becomes thinner.

The substrate 5 may be formed from quartz or a translucent ceramic material. The substrate 5 and the film 3 may transmit visible light with a transmittance of 75 to 92% inclusive.

When the component for a plasma processing apparatus is a window component installable in a processing chamber, the visible light transmittance of 75% or greater provides improved visibility into the processing chamber, thus allowing observation of the state inside the processing chamber. This structure allows immediate response to any abnormal behavior in the processing chamber. The visible light transmittance of 92% or less reduces luster that can be proportional to visible light transmittance, thus providing high antiglare properties.

The wavelength of visible light in one or more embodiments of the present disclosure ranges from 380 to 780 nm.

The substrate 5 and the film 3 in one or more embodiments of the present disclosure may transmit near-infrared light with a transmittance of 80 to 92% inclusive.

When the component for a plasma processing apparatus is used as the above window component with the near-infrared light transmittance of 80% or greater, the manufacturing efficiency can be improved, for example, in forming a thin film on a substrate such as a semiconductor wafer by applying an infrared laser beam onto a target (a source material of the film) in the processing chamber through the window component. In contrast, the component with the near-infrared light transmittance of 92% or less can prevent malfunctions of components installed in the processing chamber and susceptible to infrared light.

The wavelength of near-infrared light in one or more embodiments of the present disclosure ranges from 780 to 2500 nm.

The transmittance of visible light and that of the near-infrared light through the substrate 5 and the film 3 may be measured using a Fourier transform infrared spectrophotometer (FTIR) such as IRPrestige-21 (Shimadzu Corporation).

The measurement is performed under the conditions below.

Resolution: 4 $cm^{-1}$
Number of integrations: 50 times
Mode: Transmission method
Detector: DLATGS detector
Background atmosphere: Air A method for manufacturing the component for a plasma processing apparatus according to one or more embodiments of the present disclosure will now be described.

A method for manufacturing the substrate will be described first.

An aluminum oxide ($Al_2O_3$) powder A with a mean particle size of 0.4 to 0.6 μm and an aluminum oxide powder B with a mean particle size of about 1.2 to 1.8 μm are prepared. A silicon oxide ($SiO_2$) powder as a Si source and a calcium carbonate ($CaCO_3$) powder as a Ca source are prepared. The silicon oxide powder is a fine powder with a mean particle size of 0.5 μm or smaller. To obtain an alumina ceramic material containing Mg, a magnesium hydroxide powder is used. Hereafter, powders other than the aluminum oxide powder A and the aluminum oxide powder B are collectively referred to as first subelement powders.

A predetermined amount of each first subelement powder is weighed out. Subsequently, the aluminum oxide powder A and the aluminum oxide powder B are weighed to have a mass ratio of 40:60 to 60:40 to obtain an aluminum oxide powder mixture. The mixture is prepared to form an alumina ceramic material with an $Al_2O_3$ (converted from Al) content of 99.4% or greater by mass of the total mass (100%) of the elements contained in the alumina ceramic material. To prepare the first subelement powders, the amount of Na in the aluminum oxide powder mixture may be determined first. The amount of Na is then converted to $Na_2O$ to form an alumina ceramic material. The first subelement powders are weighed to have the ratio of 1.1 or less as the ratio of the converted $Na_2O$ value to a value of oxides from converting the elements contained in the first subelement powders (in this example, Si and Ca) to oxides.

With respect to 100 parts by mass in total of the alumina powder mixture and the first subelement powders, 1 to 1.5 parts by mass of a binder such as polyvinyl alcohol (PVA), 100 parts by mass of a solvent, and 0.1 to 0.55 parts by mass of a dispersant are placed into a stirrer together with the alumina powder mixture and the first subelement powders. These are then mixed and stirred to obtain slurry.

The slurry is spray-granulated, and the resulting granules are molded with, for example, a powder press molding device or a hydrostatic press molding device into a predetermined shape, which is cut as appropriate into a plate-like molded body.

The resulting molded body is then fired at a firing temperature of 1500 to 1700° C. inclusive for 4 to 6 hours inclusive. The surface of the resultant body on which the film is to be formed is then polished with diamond abrasive grains having a mean grain size of 1 to 5 μm inclusive and an abrasive disc of tin. This completes the substrate.

Figure 2:
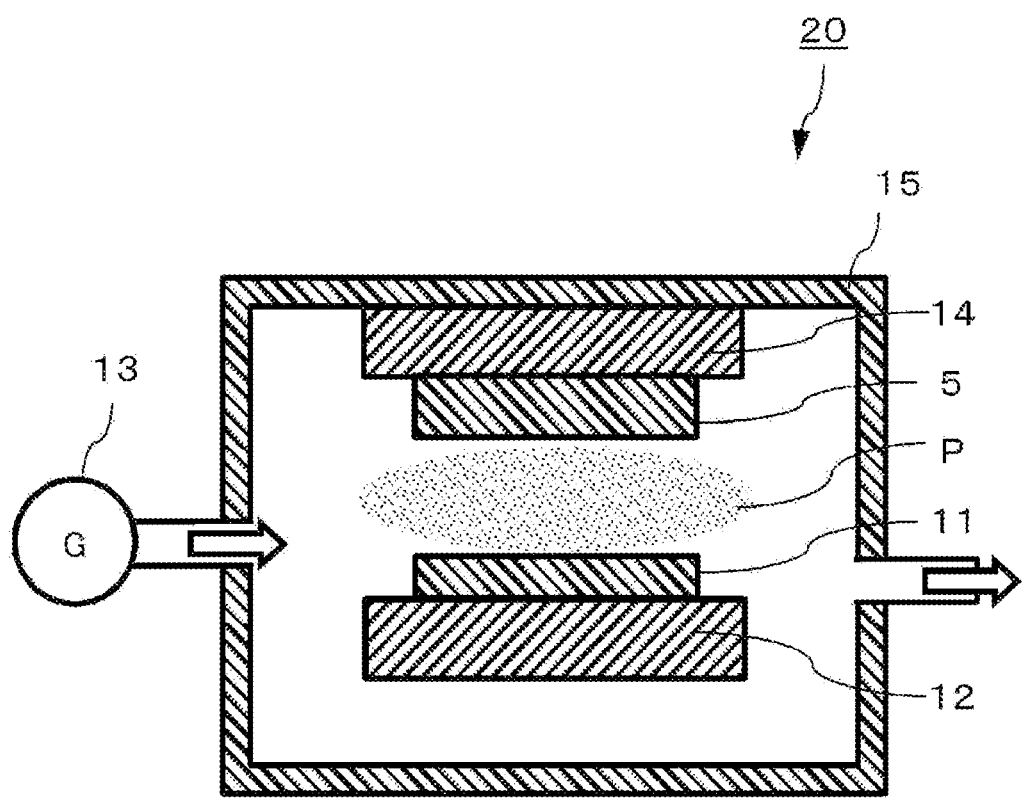
FIG. 2 is a schematic diagram of a sputtering apparatus used to form a component for a plasma processing apparatus according to one or more embodiments of the present disclosure.

A method for forming the film will now be described with reference to FIG. 2. FIG. 2 is a schematic diagram of a sputtering apparatus 20. The sputtering apparatus 20 includes a chamber 15, a gas supply source 13 connected to the chamber 15, an anode 14 and a cathode 12 located in the chamber 15, and a target 11 connected adjacent to the cathode 12.

To form the film, the substrate 5 obtained by the method described above is placed adjacent to the anode 14 in the chamber 15. At the opposite position in the chamber 15, the target 11 formed mainly from a rare earth element, yttrium metal in this example, is placed adjacent to the cathode 12. The chamber 15 is then decompressed using a vacuum pump, and argon and oxygen are supplied as gas G from the gas supply source 13. The pressure of the argon gas to be supplied is 0.1 to 2 Pa inclusive, and the pressure of the oxygen gas is 1 to 5 Pa inclusive.

The component for a plasma processing apparatus having the arithmetic mean of the compressive stress σ11 and the compressive stress σ22 of 200 to 1000 MPa inclusive may be obtained by using argon gas supplied at a pressure of 0.1 to 1 Pa inclusive and oxygen gas at a pressure of 1 to 5 Pa inclusive.

The component for a plasma processing apparatus with the coefficient of variation of each of the compressive stress σ11 and the compressive stress σ22 being 0.5 or less may be obtained by using argon gas supplied at a pressure of 0.1 to 0.5 Pa inclusive and oxygen gas at a pressure of 1 to 5 Pa inclusive.

An electric field is then applied between the anode 14 and the cathode 12 from a power supply to generate plasma P, and a metal yttrium film is deposited on the surface of the substrate 5 by sputtering. A film with a thickness of sub-nanometers forms per deposition. The metal yttrium film is then oxidized. Through repeated deposition and oxidation of the metal yttrium film, the film forms with a total thickness of 10 to 200 μm inclusive. The resultant component for a plasma processing apparatus according to one or more embodiments of the present disclosure includes a film of yttrium oxide.

The component for a plasma processing apparatus having the pores with the area ratio of 1.5 to 6% inclusive may be obtained with a substrate having pores with an area ratio of 1 to 5% inclusive in the surface facing the film.

The component for a plasma processing apparatus having the pores with the average sphericity of 60% or greater may be obtained with a substrate having pores with an average sphericity of 62% or greater in the surface facing the film.

The component for a plasma processing apparatus having the pores with the kurtosis Ku of circular equivalent diameters of 0.5 to 2 inclusive may be obtained with a substrate having pores with a kurtosis Ku of circular equivalent diameters of 0.6 to 1.8 inclusive in the surface facing the film.

The component for a plasma processing apparatus having the pores with the skewness Sk of circular equivalent diameters of 3 to 5.6 inclusive may be obtained with a substrate having pores with a skewness Sk of circular equivalent diameters of 3.1 to 5.4 inclusive in the surface facing the film.

The component for a plasma processing apparatus having the voids with closed tips inside the film is obtained by first forming an yttrium oxide film, or a first layer, on a substrate with the procedure described above. The substrate with the first layer is then removed from a chamber, and the film surface of the first layer undergoes smoothing. The smoothing includes polishing of the film surface of the first layer with diamond abrasive grains having a mean grain size of 1 to 5 μm inclusive and an abrasive disc of tin to obtain a processed surface (polished surface).

The component for a plasma processing apparatus having the voids extending in the thickness direction from the recesses on the surface of the substrate facing the film and with closed tips inside the film may be obtained by preparing a substrate with pores with an average diameter of 1 to 8 μm inclusive in the surface facing the film and polishing the film surface of the first layer 1 to have the average diameter of pores of 0.1 to 5 μm inclusive.

When the sputtering apparatus 20 forms a film on a substrate having pores with an average diameter of 1 to 8 μm inclusive in the surface facing the film, each void is narrower in its part nearer the film surface than in its part nearer the recess on the substrate in the thickness direction of the film in a cross section. The film surface of the first layer is polished to have the average diameter of pores of 0.1 to 5 μm inclusive, and the second layer (described below) is formed to have the closed voids inside the film.

The second layer having yttrium oxide as a main component is formed on the processed surface of the first layer with the same procedure as for the first layer. This completes the component for a plasma processing apparatus.

The component for a plasma processing apparatus with the substrate and the film with the transmittance of visible light of 75 to 92% inclusive may be obtained with a substrate having the transmittance of visible light of 87 to 99% inclusive.

The component for a plasma processing apparatus with the substrate and the film having the transmittance of near-infrared light of 80 to 92% inclusive may be obtained with a substrate having the transmittance of near-infrared light of 83 to 95% inclusive.

A film of yttrium fluoride may also be formed with the same process as described above except the oxidation being replaced by fluorination.

A film of yttrium oxyfluoride may be formed through repeated deposition, oxidation, and fluorination of a metal yttrium film in this order to form the film.

A film of yttrium nitride may be formed with the same process as described above except oxidation being replaced by nitridation.

The power supply may supply either radio frequency power or direct current power.

The component for a plasma processing apparatus according to one or more embodiments of the present disclosure produces fewer particles both inside the pores and from microcrack extension. The component may be a window component for transmitting radio frequency that generates plasma, a shower plate for distributing gas for generating plasma, or a susceptor for placement of a semiconductor wafer.

The component for a plasma processing apparatus according to one or more embodiments of the present disclosure has high strength of bonding to the substrate over a long period of time.

The plasma processing apparatus according to one or more embodiments of the present disclosure is highly reliable.

The present disclosure may be embodied in various forms without departing from the spirit or the main features of the present disclosure. The embodiments described above are thus merely illustrative in all respects. The scope of the present disclosure is defined not by the description given above but by the claims. Any modifications and alterations contained in the claims fall within the scope of the present disclosure.

REFERENCE SIGNS LIST 1 first layer
2 second layer
3 film
4 pore
5 substrate
6 pore (closed pore)
7 recess
8 void
10 component for plasma processing apparatus
11 target
12 cathode
13 gas supply source
14 anode
15 chamber
20 sputtering apparatus

The invention claimed is:

1. A component for a plasma processing apparatus, the component comprising:
a substrate; and
a film on at least a part of the substrate, the film comprising an oxide, a fluoride, an oxyfluoride, or a nitride of a rare earth element,
wherein a ratio $\sigma 22/\sigma 11$, of a compressive stress $\sigma 11$ occur across a surface of the film to be exposed to plasma, and a compressive stress $\sigma 22$ to occur across the surface in a direction perpendicular to the compressive stress $\sigma 11$, is 5 or less.

2. The component according to claim 1, wherein an arithmetic mean of the compressive stress $\sigma 11$ and the compressive stress $\sigma 22$ is 200 to 1000 MPa inclusive.

3. The component according to claim 1, wherein a coefficient of variation of each of the compressive stress $\sigma 11$ and the compressive stress $\sigma 22$ is 0.5 or less.

4. The component according to claim 1, wherein the film has the surface to be exposed to the plasma having an arithmetic mean roughness Ra of 0.01 to 0.1 μm inclusive, the film has a plurality of pores in the surface, and a value resulting from subtracting an average of circular equivalent diameters of the plurality of pores from an average of distances between centroids of neighboring pores of the plurality of pores is 28 to 48 μm inclusive.

5. The component according to claim 4, wherein the plurality of pores of a total area of the film constitutes 1.5 to 6% inclusive.

6. The component according to claim 4, wherein the plurality of pores has an average sphericity of 60% or greater.

7. The component according to claim 4, wherein each pore of the plurality of pores has a circular equivalent diameter with a kurtosis Ku of 0.5 to 2 inclusive.

8. The component according to claim 4, wherein each pore of the plurality of pores has a circular equivalent diameter with a skewness Sk of 3 to 5.6 inclusive.

9. The component according to claim 1, wherein the film includes a void extending in a thickness direction from a recess on a surface of the substrate facing the film, and the void has a closed tip inside the film.

10. The component according to claim 9, wherein a part of the void nearer the surface of the film to be exposed to the plasma is narrower than a part of the void nearer the recess on the surface of the substrate in the thickness direction of the film in a cross section.

11. The component according to claim 1, wherein the substrate comprises quartz or a translucent ceramic material, and the substrate and the film transmit visible light with a transmittance of 75 to 92% inclusive.

12. The component according to claim 11, wherein the substrate and the film transmit near-infrared light with a transmittance of 80 to 92% inclusive.

13. A plasma processing apparatus, comprising:
the component according to claim 1.

14. A method to manufacture a component for a plasma processing apparatus, comprising:
positioning a substrate in a chamber adjacent to an anode;
positioning a target in the chamber adjacent to a cathode, the target comprising a rare earth element;
decompressing the chamber;
pressurizing the chamber with a gas;
applying an electric field between the anode and the cathode to generate plasma;
in response to applying the electric field, depositing a metal yttrium film on a surface of the substrate by sputtering, wherein the film has a subnanometer thickness;
oxidizing the metal yttrium film;
repeating the depositing and oxidizing steps until the thickness of the film is 200 μm or less.

15. A component for a plasma processing apparatus manufactured using the method of claim 14, the component comprising:
a substrate; and
a film on at least a part of the substrate, the film comprising an oxide, a fluoride, an oxyfluoride, or a nitride of a rare earth element, wherein a ratio $\sigma22/\sigma11$, of a compressive stress $\sigma11$ occur across a surface of the film to be exposed to plasma, and a compressive stress $\sigma22$ to occur across the surface in a direction perpendicular to the compressive stress $\sigma11$, is 5 or less.

* * * * *